United States Patent [19]

Reed et al.

[11] 4,335,348

[45] Jun. 15, 1982

[54] CABLE CONDUCTOR CONTINUITY TESTER WITH MAGNETICALLY COUPLED DRIVE MEANS AND SENSOR

[75] Inventors: William C. Reed, Lilburn; Donald T. Smith, Norcross, both of Ga.

[73] Assignee: Bell Telephone Laboratories, Incorporated, Murray Hill, N.J.

[21] Appl. No.: 139,100

[22] Filed: Apr. 10, 1980

[51] Int. Cl.³ ........................................... G01R 31/02
[52] U.S. Cl. .................................................... 324/51
[58] Field of Search .............................. 324/51, 52, 66

[56] References Cited

U.S. PATENT DOCUMENTS

| | | | |
|---|---|---|---|
| 3,344,348 | 9/1967 | McNair et al. | 324/66 |
| 3,719,883 | 3/1973 | Pentecost | 324/51 |
| 4,075,675 | 2/1978 | Burkett et al. | 324/51 X |
| 4,142,143 | 2/1979 | Daniel | 324/51 |

Primary Examiner—Gerard R. Strecker
Attorney, Agent, or Firm—R. O. Nimtz

[57] ABSTRACT

Apparatus, and associated methodology, for testing shielded, multipair cables to verify conductor and splice continuity comprises: means (120,122) for magnetically coupling excitation source (110) to the conductor (106) under test; and means (121,123) for magnetically coupling a series path comprising the conductor under test to detector means (130,131,140-143,150,160,200-207,301-313). The detector means includes means (160) for indicating that the conductor (106) and splice (108) are electrically continuous whenever the detector means senses a signal above a predetermined threshold.

1 Claim, 3 Drawing Figures

CABLE CONDUCTOR CONTINUITY TESTER WITH MAGNETICALLY COUPLED DRIVE MEANS AND SENSOR

BACKGROUND OF THE INVENTION

1. Field of the Invention

This invention relates generally to testing a conductor path for continuity and, more particularly, to apparatus and associated methodology for detecting an open in a multipair cable conductor.

2. Description of the Prior Art

In the subscriber loop portion of telecommunications systems, shielded multipair cable is presently the predominant medium utilized for signal transmission. The cable generally comprises many individually insulated conductors twisted together into pairs; the pairs are contained within a single protective sheath which includes a continuous metallic layer. Typically, each twisted pair connects a customer premises to a switching point, usually a central office, or numerous pairs connect switching points.

In providing for new transmission facilities, or in rearranging old facilities, it is oftentimes necessary to join or splice together a number of cable segments to establish an overall cable route. In these situations, testing for defective splices is effectuated after the splicing activity to insure reliable completion of the splicing operation.

The splicing activity involves the step of electrically interconnecting predetermined wires from one cable segment with companion wires from an adjacent cable segment so as to form a DC short at the junctures of the wire segments. During this splicing step, wires may be rendered defective in a number of ways. For instance, a wire may be inadvertently broken and the break may not be visually perceptible due to the insulating coating on the wire. If a crimp-type connector is utilized to join the wires, a faulty connector may not effect a short between wires or a malfunctioning crimping tool may not apply sufficient pressure to form a solid short. These types of faults preclude using the wire because of the service-affecting nature of the fault.

To detect an open or faulty splice, various techniques and equipment have been developed. However, each method has at least one major shortcoming.

The most typical prior art fault-detecting technique is that of measuring the DC resistance of the spliced wires on an end-to-end basis. Since the far end points of the wire segments are generally not available at one geographical location, the operation involves two-ended testing. This procedure can be expensive and time-consuming because the two-ended nature of the technique generally requires personnel at both ends to manipulate apparatus. Moreover, other faults in the cable segments may interfere with the end-to-end testing and yield meaningless test results.

Other prior art techniques for testing an electrical path for conductivity whenever the other ends of the path are spaced apart have focused on monitoring the local path comprising the splice itself and the portion of the wire segments proximate the splice.

Representative of these localized testing techniques is the subject matter of U.S. Pat. No. 3,344,348, issued to I. M. McNair, Jr. et al on Sept. 26, 1967. The McNair et al invention discloses apparatus to monitor splice resistances during a so-called cut-closed cable operation, that is, the operation of transferring a pair from a portion of an old cable to a new cable portion that is remotely bridged to the old cable. One step in the operation calls for insuring that the final splice joining each conductor from the new pair to each conductor from the remaining portion of the old pair is electrically a short. Two test set leads, both directly connected to the same conductor and proximate each other, straddle the point of cutting of the old wire and the eventual point of splicing together the old and new conductors. A cut causes a large impedance in the local series path comprising the two test set leads and the short piece of conductor between the leads, whereas a good splice effectively shorts the leads. Circuitry coupled to the leads monitors for the alternating open-short conditions and signals accordingly.

A major shortcoming with these techniques is the necessity of making direct metallic contact with the individual wires or conductors. This contact is typically effected with an insulation-piercing tool. Since many splice points are not moisture-proofed or hermetically sealed after the splicing operation, preservation of insulation integrity is critical to avoid corrosion, leakage and other failures that cause service-affecting or service-degrading transmission.

Another limitation of directly connecting test apparatus to the metallic conductor occurs in applications involving splicing operations on working or in-use cable pairs. A direct connection to the DC path generally causes a "hit," that is, a transient disturbance caused by modifying the impedance of the propagation medium. A hit is particularly troublesome for high-speed transmission due to the susceptibility of the signal to high-frequency interference.

SUMMARY OF THE INVENTION

These and other deficiencies, shortcomings and limitations are mitigated in accordance with the present invention of an improved continuity verification test set particularly adapted to detecting faulty cable splices or open conductors. The apparatus utilizes electromagnetic coupling to the conductor path under test to preserve insulation integrity and avoid hits.

Broadly speaking, the apparatus comprises: means, magnetically coupled to one path from a plurality of parallel electrical paths, for directly propagating a high-frequency, AC signal along the path under test and indirectly along the remaining paths; and means, magnetically coupled to the test path, for detecting whenever an induced signal is of sufficient strength relative to a predetermined threshold.

In the preferred embodiment, the testing arrangement includes: a high-frequency, AC source; a drive transformer to couple the source to a secondary circuit comprising the series combination of the splice connection under test and the longitudinal impedances of the conductors joined by the splice; a sense transformer coupled to the above secondary; and a detector, responsive to the sense transformer, to determine if the sensed signal is above a preselected threshold indicative of an acceptable connection. Preferably, both the drive and sense transformers are mechanically adapted to fully encompass the conductors by mounting a portion of each transformer within a holder. Closure of a hinged or slidable member causes the remaining portions of the cores to align and abut the cores within the holder and thereby complete the magnetic paths.

In addition to avoiding hits and preserving insulation integrity, another feature of the continuity tester is that additional interference is precluded since the frequency of the AC source is above the band of signals exploiting the transmission medium. The arrangement may therefore be used in an application wherein some cable pairs are working or in service.

The organization and operation of this invention will be better understood from a consideration of the detailed description of an illustrative embodiment thereof, which follows, when taken in conjunction with the accompanying drawing.

DETAILED DESCRIPTION

Figure 1:
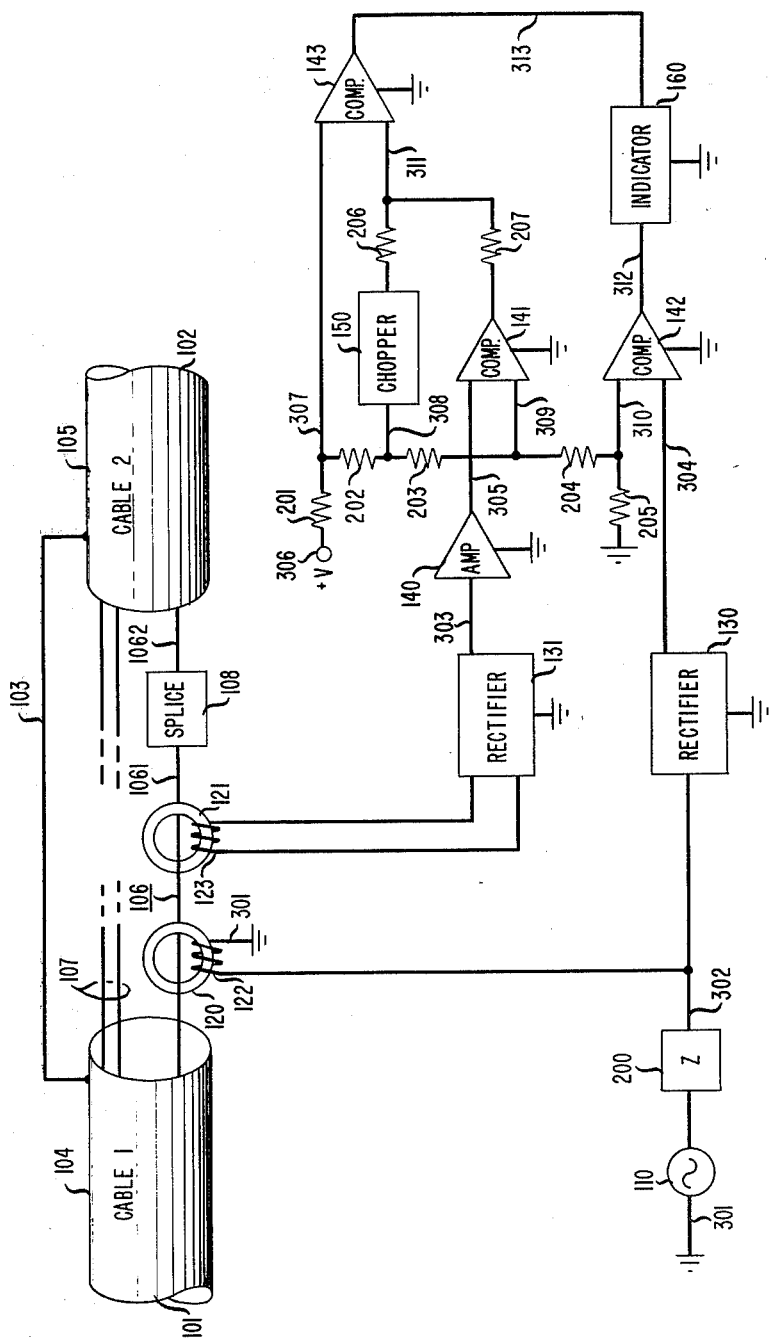
FIG. 1 is a diagram, in combined schematic, block and pictorial form, depicting an illustrative embodiment of the present invention of a continuity test set wherein a spliced pair is prepared to undergo testing.

FIG. 1 is a depiction, partly in schematic and block diagram form and partially in pictorial form, displaying an illustrative embodiment of the continuity tester. Both the structure and operation of the tester are provided by the discussion that follows.

FIG. 1 depicts the status of a splicing operation at the completion of the splicing activity wherein conductors from cable segment 101 have been spliced to companion conductors from cable segment 102. In particular, conductors grouped as bundle 107 have or will be tested, and conductor 106 is prepared for testing. The continuity tester is to check the integrity of splice 108, which connects the individual conductor segments 1061 and 1062 emanating from cables 101 and 102, respectively. Splice 108 may be effectuated by any one of the many conventional prior art techniques.

Any conductor in a cable segment is electromagnetically coupled to the accompanying cable shield encompassing the conductor. The effective impedance, as a function of frequency, between the conductor and shield, when characterized as a driving-point impedance, is designated the longitudinal impedance. The longitudinal impedance is dependent on the electrical characteristics exhibited by all other conductors in a cable segment, particularly the impedances that terminate the conductors. However, once conditions are fixed, the longitudinal impedance is stabilized.

All conditions affecting impedance characteristics have been fixed in the cable circuit depicted in FIG. 1. Bond 103 electrically shorts shield 104 of cable segment 101 with shield 105 of cable segment 102. Bonding is a part of any splicing operation so that continuity of the contiguous shield segments is maintained along the cable route. (It is important to maintain shield continuity for reasons independent of the testing operation; shielding provides protection for personnel and equipment and reduces interference.) In addition, the terminal conditions of bundle 107 and conductor 106 are fixed.

In the configuration displayed in FIG. 1, the following series current path is identifiable: conductor segment 1061; the impedance represented primarily by the longitudinal impedance of conductor segment 1061; bond 103; the impedance represented primarily by the longitudinal impedance of conductor segment 1062; and conductor segment 1062. This path will be referred to as the secondary path for reasons that will be apparent shortly.

The tester illustrated in FIG. 1 employs magnetic coupling to sense the integrity of the secondary path. Magnetic core 120, the drive core, encompasses conductor segment 1061. Winding 122 on core 120 serves as the means for exciting core 120. Excitation signal at one end of winding 122 is provided on lead 302 via source 110 in series with impedance 200; the other end of winding 122 is grounded via ground lead 301. Thus, in this configuration, core 120 magnetically couples energy provided to winding 122 to the secondary circuit comprising the above-identified secondary path.

Magnetic core 121, the sense core, also encompasses conductor segment 1061. Winding 123 on core 121 senses the strength of the signal induced in the secondary path. A detected signal above a predetermined threshold indicates a low impedance secondary path which, in turn, indicates a good connection at splice 108.

The level of the secondary signal is established by amplification and comparator circuitry. Winding 123 serves as the input to rectifier 131. The output of rectifier 131 appears on lead 303, which serves as the input to amplifier 140. The output of amplifier 140, on lead 305, provides one input to comparator 141. The other input to comparator 141, on lead 309, is derived from a voltage divider network. The voltage divider comprises: a DC voltage source (+V), appearing on lead 306, and a series arrangement of five resistors 201 through 205. The selection of the voltage at the juncture of resistors 203 and 204, which establishes the voltage on lead 309, is determined by a number of factors, including: the strength of source 110; the number of turns on windings 122 and 123; the longitudinal impedances corresponding to cable segments 101 and 102; and the resistance of splice 108 that is considered acceptable (generally milliohms). For an acceptable connection at splice 108, the output of comparator 141 is 0 volts, whereas a poor splice yields +V volts.

The output of comparator 141 is used to level shift the output of chopper oscillator 150, which operates at a subaudible rate. The rate is chosen so that, for example, if indicator 160 is a light source, the light flickers at a speed perceptible to the eye or, if indicator 160 is a tone source, the tone is interrupted at a speed noticeable to the ear. Chopper 150 generates an alternating signal about the voltage level appearing on lead 308, which connects to the juncture of resistors 202 and 203. The peak amplitude of the signal level from chopper 150 is less than the voltage difference between leads 307 and 308. Level shifting of the chopped signal is accomplished by connecting both the output of chopper 150, through resistor 206, and the output of comparator 141, through resistor 207, to one input terminal of comparator 143. The other input signal is determined by the voltage at the juncture of resistors 201 and 202 and appears on lead 307. For an acceptable connection at splice 108, the output signal from comparator 143, appearing on lead 313, is 0 volts; however, a nonacceptable connection yields a voltage alternating between 0 and +V volts at the rate of chopper 150.

In order to place cores 120 and 121 about conductor segment 1061, it is necessary to split each core into two piece parts and, once segment 1061 is fully encompassed, to align and abut the core parts to complete the magnetic path. The tester of FIG. 1 is inhibited in its operation until each magnetic path is completed. This is accomplished by feeding the signal appearing on lead 302 into rectifier 130. Whenever the magnetic path of core 120 is closed, its inductance is high and the voltage on lead 302 is high; conversely, a low inductance generates a low voltage. Impedance 200 is appropriately selected to provide suitable separation between the high and low magnetic states. The output of rectifier 130 appears on lead 304 and serves as one input to comparator 142. The other input to comparator 142 is established by the voltage level appearing at the junction of divider resistors 204 and 205. When core 120 is open, comparator 142 produces a 0-volt output on lead 312; otherwise, +V.

As mentioned earlier, indicator 160 is preferably a light or tone source. The voltage difference between leads 312 and 313 provides the appropriate drive signals to indicator 160. With respect to lead 312, a closed magnetic path for core 120 yields +V volts. Regarding lead 313, an acceptable connection at splice 108 provides 0 volts; otherwise, a chopped signal between +V and 0 obtains.

Figure 2:
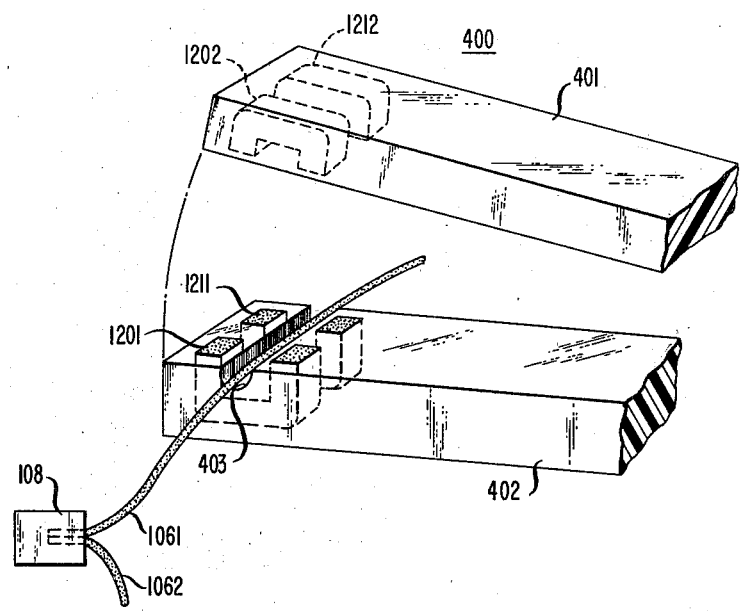
FIG. 2 depicts, in perspective view, an illustrative embodiment of the clamp-end portion of a hinged tool housing magnetic drive and sense cores adapted for accessing a conductor undergoing test.

Both drive core 120 and sense core 121 are mechanically adapted to fully encompass the conductor under test. FIG. 2 depicts one embodiment, tool 400, utilized to access a conductor for testing. One half of each core 120 and core 121 is mounted in bottom jaw 402 whereas the other half of each core is mounted in top jaw 401. The wire to be tested, conductor 1061, is placed in semicircularly-shaped channel 403, which is laterally formed on the top surface of jaw 402 proximate its end. The bottom half of core 120, designated as element 1201, is embedded within jaw 402 and straddles channel 403 so that the plane containing element 1201 is perpendicular to the lateral orientation of channel 403. Similarly, the bottom half of core 121, designated member 1211, lies in a plane parallel to the plane of element 1201 and has the same orientation relative to channel 403. In addition, the upper halves of cores 120 and 121, designated as elements 1202 and 1212, respectively, are mounted in upper jaw 401. Elements 1202 and 1212 are arranged so that closure of jaws 401 and 402 causes oppositely aligned core halves to abut and complete the individual magnetic paths.

Figure 3:
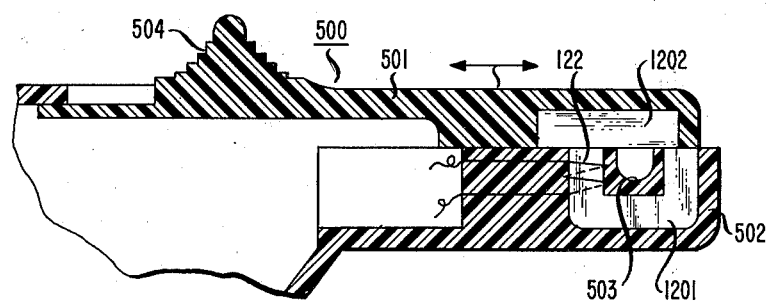
FIG. 3 depicts, in side elevational view and partial cutaway, an illustrative embodiment of alternative means for accessing the test conductor comprising a two-part, slidable holder housing the magnetic cores.

FIG. 3 depicts an alternative to hinged tool 400 of FIG. 2. In FIG. 3, top jaw 501 of tool 500 is slidable in relation to bottom jaw 502. A conductor to be tested is inserted in channel 503, formed laterally near the end of jaw 502. Pressure exerted on thumb control 504 causes jaw 502 to slide forward (or backward upon completion of a test). Core portion 1201, embedded within jaw 502, and complementary core portion 1202, embedded in jaw 501, abut to complete the magnetic path. Core 121 is arranged similarly to core 120 and is placed in side-by-side fashion relative to core 120.

It will be further understood that the testing arrangement herein described is not limited to specific forms disclosed by way of illustration, but may assume other embodiments limited only by the scope of the appended claims.

We claim:

1. Apparatus for verifying the continuity of a splice path (106), said path comprising a first wire (1061) emanating from a first cable segment (101) joined to a second wire (1062) emanating from a second cable segment (102), said first segment and said second segment having continuous metallic shields (104,105) electrically interconnected (103), said apparatus characterized by a source comprising an oscillator (110) and a reference impedance (200) connected in series with said oscillator, a drive transformer comprising a first split core (120) for coupling to said path and a drive winding (122) connected to said source, a sense transformer comprising a second split core (121) for coupling to said path and a sense winding (123) coupled to said second core, first averaging means (130), connected to said source, for providing a first signal level (304) indicative of the voltage developed across said impedance, second averaging means (131,140), coupled to said sense winding, for providing a second signal level (305) indicative of the magnitude of the signal induced in said sense winding, means (201-205,306) for generating a first reference level (310) indicative of a closed magnetic path in said first core; and a second reference level (309) indicative of a closed magnetic path in said second core and said continuity of said splice path, first comparison means (142), responsive to said first averaging means and said means for generating, for providing a first activation signal (312) whenever said first signal level exceeds said first reference level, second comparison means (141,143,150), responsive to said second averaging means and said means for generating, for providing a second activation signal (313) whenever said second signal level exceeds said second reference level, and means (160), coupled to said first comparison means and said second comparison means, for indicating said continuity upon sensing the presence of both said first activation signal and said second activation signal.

* * * * *